(12) United States Patent
Clark et al.

(10) Patent No.: US 8,933,314 B2
(45) Date of Patent: Jan. 13, 2015

(54) MUSICAL EFFECTS DEVICES

(75) Inventors: James Hastings Clark, St. Neots (GB); Morag E. Clark, St. Neots (GB); John M. McAuliffe, Halifax (GB)

(73) Assignee: Sonuus Limited, St. Neots, Cambridgeshire (GB)

(*) Notice: Subject to any disclaimer, the term of this patent is extended or adjusted under 35 U.S.C. 154(b) by 220 days.

(21) Appl. No.: 13/596,635

(22) Filed: Aug. 28, 2012

(65) Prior Publication Data
US 2013/0055879 A1 Mar. 7, 2013

(30) Foreign Application Priority Data

Sep. 2, 2011 (GB) .................................. 1115184.2
May 10, 2012 (GB) .................................. 1208162.6

(51) Int. Cl.
| | | |
|---|---|---|
| *G01P 3/00* | (2006.01) | |
| *G10H 1/00* | (2006.01) | |
| *G10H 1/055* | (2006.01) | |
| *G10H 1/34* | (2006.01) | |

(52) U.S. Cl.
CPC ........... *G10H 1/0091* (2013.01); *G10H 1/0555* (2013.01); *G10H 1/348* (2013.01); *G10H 2220/505* (2013.01)
USPC ........................................................ 84/626

(58) Field of Classification Search
CPC ... G10H 1/0091; G10H 1/348; G10H 1/0555; G10H 2220/505
USPC ........................................................ 84/626
See application file for complete search history.

(56) References Cited

U.S. PATENT DOCUMENTS

| | | | |
|---|---|---|---|
| 3,530,224 A | 9/1970 | Plunkett et al. | |
| 4,580,478 A | 4/1986 | Brosh et al. | |
| 4,838,139 A | 6/1989 | Fiori, Jr. | |
| 6,153,822 A | 11/2000 | Toba et al. | |
| 6,859,541 B1 | 2/2005 | Hilton | |
| 7,667,129 B2 * | 2/2010 | Chidlaw et al. | 84/723 |
| 2002/0140419 A1 | 10/2002 | Duret | |
| 2006/0278068 A1 | 12/2006 | Nielsen et al. | |
| 2012/0212241 A1* | 8/2012 | Wallace et al. | 324/686 |
| 2013/0287227 A1* | 10/2013 | Wallander | 381/103 |

FOREIGN PATENT DOCUMENTS

| | | |
|---|---|---|
| GB | 2320125 A | 6/1998 |
| WO | WO 2011/128698 A1 | 10/2011 |

OTHER PUBLICATIONS

GB Search Report for corresponding GB1115184.2 completed Dec. 20, 2011.

* cited by examiner

*Primary Examiner* — Jianchun Qin
(74) *Attorney, Agent, or Firm* — Tarolli, Sundheim, Covell & Tummino LLP

(57) ABSTRACT

We describe a musical effect device comprising drive electronics to drive a first tuned resonant circuit at a resonant frequency, a moveable mechanical control associated with a second, passive tuned resonant circuit and read-out electronics coupled to the first tuned resonant circuit to sense a position of the control. A first frequency of resonance of the first tuned resonant circuit matches a second frequency of resonance of the second, passive tuned circuit, and the first and second frequency resonance match a resonant frequency of the drive signal. The first tuned resonant circuit has an input coupled to the drive electronics, an output coupled to the read-out electronics and a resonant LC circuit coupled in series between the input and output. The variable output signal is dependent on an amplitude of a signal at the output of the first tuned resonant circuit.

9 Claims, 7 Drawing Sheets

MUSICAL EFFECTS DEVICES

RELATED APPLICATIONS

The present invention claims priority from Great Britain Patent Application Nos. GB 1208162.6, filed 10 May 2012, and GB1115184.2 filed 2 Sep. 2011.

FIELD OF THE INVENTION

We describe sensors for musical instrument control, and related musical effect devices and methods.

BACKGROUND

Musicians often use electronic effects to modify the sound of their instrument during composition and recording and during live performances. For many of these effects it is desirable for the musician to be able to control an aspect of the effect and this is typically achieved by interaction with controllers such as linear sliders, also known as faders, rotary knobs or foot pedals, also known as expression pedals. These controllers permit a musical effect to be varied continuously between a maximum and a minimum of that effect.

Using the example of the expression pedal, the effect of the expression pedal on the musical sound varies as the musician presses the pedal. The pedal is thus the controller that the musician uses to apply the desired amount of the effect to the sound. Different expression pedals exist such as volume pedals where the sound level is modified, wah-wah pedals where the frequency characteristics of the sound is modified and generic controller pedals where a control signal is used, for example, to adjust a parameter of a synthesizer. All of these pedals have in common the need to know how much the pedal has been pressed by the musician so that this can be converted into application of the correct amount of the effect being controlled by the pedal.

Other controllers, such as faders and knobs, use a similar principle to that described for the expression pedal. For a fader, the amount of the effect to be applied to the sound is determined by how much the fader has been moved. For a knob, the amount of the effect to be applied to the sound is determined by how far the knob has been rotated.

It is also possible to control a musical effect by using a controller which does not require the musician to touch it. For example, non-contact optical controllers can detect the proximity of an object such as the musician's hand as is described in U.S. Pat. No. 6,153,822 or foot as is described in U.S. Publication No. 2006/0278068 A1.

All of these controllers have in common the fact that the control of the effect is via the separation of a fixed reference element and a moveable element (such as pedal, slider, knob, ring), the position of which is chosen by the musician to achieve the desired musical effect.

The control of the musical effect can be accomplished in two ways: direct and indirect. Direct control of the effect is where the movement of the moveable element causes direct variation of a circuit element in an electronic circuit. Direct control therefore requires a circuit element whose electrical response can be varied by the movement of said moveable element. Indirect control of the effect is where the position of said moveable element with respect to said fixed reference element is measured to give a value of the mutual separation between said elements and this mutual separation value is used to control a separate circuit element in an electronic circuit or is used as an input parameter to a digital signal processing algorithm. It is therefore a requirement for indirect control to measure accurately the mutual separation of said fixed reference element and said moveable element.

Volume control pedals and wah-wah pedals have characteristically used potentiometers as a direct means of controlling the sound effect, such as is described in U.S. Pat. No. 3,530,224. A significant problem associated with this use of potentiometers is that most potentiometers are not designed for the large number of operating cycles required in such controllers, and those that are very expensive. As potentiometers wear out, the reproducibility of the control is compromised and noise can be introduced into the corresponding electronic circuits. Indeed it is common to need to replace the potentiometers in wah-wah and volume control pedals when they wear out. It is therefore highly desirable to have an alternative solution that is robust and does not suffer from wear during operation.

Optical position sensing can be used as an alternative to potentiometers, for example as is described in U.S. Pat. No. 6,859,541 B1, but the performance of such systems is vulnerable to degradation by contamination and they need to be cleaned to retain optimal performance. Moreover, they can contain delicate optical elements such as shades or films with graduated transparency which make then sensitive to shock and vibration with a corresponding reduction in long-term reliability. They can also be more expensive than potentiometers. It is therefore desirable to have an alternative position sensor that is unaffected by dirt and moisture contamination and is robust to shock and vibration such as is experienced during normal use.

Magnetic sensors such as Hall probes where a permanent magnet is moved with respect to the Hall probe are another alternative to potentiometers that is sometimes used. The inventors hereof have found that Hall probes that are able to detect precise variations in a magnetic field, such as caused by the movement of a proximate permanent magnet, are expensive and require operating voltages higher than is commonly used for a microcontroller-based musical effect. Hall probes can also be sensitive to other nearby magnetic fields which is a problem when multiple controllers are being used in proximity to one another. Moreover, magnetic sensors which detect the proximity of a permanent magnet can only be used in indirect control schemes. In electronic musical instrument applications, an alternative low-voltage, accurate and inexpensive position sensor that has the flexibility to be used in both direct and indirect control schemes is highly desirable.

Inductive proximity sensors show promise as an alternative to potentiometers. However, they are not currently used in the electronic musical industry because those that are commercially available are expensive and have technical limitations in this field of application. Commercially available inductive proximity sensors use an inductive coil and a ferrite core material to detect the presence of a nearby metallic object and this metallic object needs to be close to the inductive coil for accurate position measurements to be made, or the inductive coil needs to be prohibitively large. Moreover, this type of inductive proximity sensor will interact with others of the same type if used nearby because of their sensitivity to metallic objects; the metallic objects from the different sensors cannot be measured independently. Current inductive proximity sensors are clearly not suitable for use in electronic musical instrument applications, and an alternative solution is required.

We will describe a solution that improves the robustness of the controller so that it is substantially unaffected by dirt and moisture contamination, is not affected by the levels of shock and vibration experienced during normal use and does not wear out, that is accurate, that is inexpensive and that can be manufactured reliably and reproducibly. For maximum flexibility the new solution needs to be capable of providing accurate position sensing over a range of distances, and be capable of being operated in a multi-sensor environment.

Background prior art can be found in GB2,320,125A; U.S. Pat. No. 4,580,478 and U.S. Pat. No. 4,838,139. Each of these documents describes an arrangement in which the inductance of the active coil is changed to provide a corresponding change in resonant frequency, which is then detected. WO2011/128698 was published after the priority date of the present application, albeit it has an earlier priority date. U.S. Publication No. 2002/0140419, teaches the use of a particular circuit configuration in which the transmitted and received magnetic fields may have the same frequency, teaching the skilled person to employ 'anti-dazzle means' to distinguish between the transmitted and received fields. It is desirable to improve upon this approach.

SUMMARY OF THE INVENTION

According to a first aspect of the invention there is therefore provided a musical effect device having an input to receive an input signal from an electric or electronic musical instrument or microphone, an output to provide an output signal comprising modified version of said input signal, and an effect control circuit coupled between said input and said output to apply a controllable effect to said input signal to provide said output signal, wherein said effect control circuit has a control connection to control a level of said controllable effect applied to said input signal; and wherein said musical effect device further comprises a moveable mechanical control and a position sensor having an output coupled to said control connection, to sense a position of said moveable mechanical control, wherein said position sensor comprises: a first tuned resonant circuit; drive electronics coupled to said tuned resonant circuit to drive said first tuned resonant circuit with a drive signal at a resonant frequency; a second, passive tuned resonant circuit associated with said moveable mechanical control, wherein said electrically reactive element provides a variable modification to a response of said first tuned resonant circuit dependent on a relative position of said second, passive tuned resonant circuit with respect to first tuned resonant circuit; and read-out electronics coupled to said first tuned resonant circuit, to provide a variable output signal responsive to said relative position of said second, passive tuned resonant circuit with respect to first tuned resonant circuit, wherein said variable output signal of said read-out electronics provides said position sensor output coupled to said control connection of said effect control circuit; wherein a first frequency of resonance of said first tuned resonant circuit matches a second frequency of resonance of said second, passive tuned circuit, and wherein said first and second frequency resonance match said resonant frequency of said drive signal; wherein said first tuned resonant circuit comprises an input coupled to said drive electronics, an output coupled to said read-out electronics and a resonant LC circuit coupled in series between said input and said output; and wherein said variable output signal is dependent on an amplitude of a signal at said output of said first tuned resonant circuit.

Embodiments of the above described arrangement provide a number of advantages and, in particular, simplify interfacing with a microcontroller, are more easily incorporated into a musical effects device, and can provide increased sensitivity in such applications.

In some preferred embodiments the first tuned resonant circuit comprises an input resistor and an inductor coupled in series between the input and output of a circuit and first and second capacitors coupled in parallel between the series inductor and the common connection between the input and output, in particular one coupled to either end of the inductor. This helps to increase sensitivity.

Embodiments of the circuit operate by providing a controllable amplitude signal dependent on the mutual separation of the active and passive tuned circuits. To achieve this the resonant frequencies of the active and passive tuned circuits should be matched to one another and also to the drive frequency. In practice, however, in particular in a musical effects device, the tuning of these resonant circuits may be affected by a metal component on or adjacent which one or both of the first and second resonant circuits is mounted. This has the effect of de-tuning one or both of these circuits. Although this may be addressed to some extent by spacing an inductor of the relevant tuned circuit away from the metal component, improved techniques are desirable and in embodiments the capacitance of one or both resonant circuits is selected so that the de-tuned resonant frequencies of the or each circuit matches both the other circuit and the drive frequency. In embodiments the drive signal is generated by a microprocessor and the frequency may vary slightly with microprocessor timing and thus in embodiments the optimum capacitance values may be determined by a combination of calculations and experiment, for example for a particular manufactured device.

Interestingly in this context the inventor has determined that once the de-tuned frequencies are matched there is no substantial further de-tuning by relative movement of the tuned circuits with respect to one another. More particularly, when the de-tuned frequencies are matched the output of the active tuned circuit has a substantially constant phase offset with respect to the drive signal, and this in turn facilitates the use of sensitive synchronous detection techniques to determine the relative position of the two tuned circuits, even where the circuits are de-tuned by adjacent electrically conducting elements. It is, nonetheless, still preferable to provide an electrically non-conductive region between the coil of the or each resonant circuit and an adjacent metallic/conducting element on or adjacent which the coil is mounted.

In a related aspect the invention provides a method of controlling a musical effects device, the method comprising: providing the device with a moveable control; providing a second passive tuned resonant circuit for said moveable control; and sensing a position of said moveable control using a driven first tuned resonant circuit and read-out electronics coupled to said driven tuned resonant circuit to sense a relative position of said first and second tuned resonant circuits; wherein said sensing comprises: driving said first tuned resonant circuit, with a drive signal at a resonant frequency, at an input of said first tuned resonant circuit; providing a resonant LC circuit coupled in series between said input and an output of said first tuned resonant circuit; matching a first frequency of resonance of said first tuned resonant circuit with a second frequency of resonance of said second, passive tuned circuit and with said resonant frequency of said drive signal; and controlling said musical effects device using an amplitude of a signal at said output of said first tuned resonant circuit.

As previously mentioned, in embodiments a variable output signal may be generated by synchronous demodulation of an output of the first resonant circuit, synchronising to the drive signal. In other embodiments, however, direct control of the musical signal may be employed by modulating an audio signal onto the drive signal for the first tuned resonant circuit and afterwards recovering this by demodulation. The amplitude of this audio signal is then directly affected by the proximity of the second tuned resonant circuit, which may be used to control the amplitude of or other effects applied to the musical signal.

According to another aspect of the invention there is therefore provided a musical effect device having an input to receive an input signal from an electric or electronic musical instrument or microphone, an output to provide an output signal comprising modified version of said input signal, and an effect control circuit coupled between said input and said output to apply a controllable effect to said input signal to provide said output signal, wherein said effect control circuit has a control connection to control a level of said controllable effect applied to said input signal; and wherein said musical effect device further comprises a moveable mechanical control and a position sensor having an output coupled to said control connection, to sense a position of said moveable mechanical control, wherein said position sensor comprises: first a tuned resonant circuit; drive electronics coupled to said tuned resonant circuit to drive said first tuned resonant circuit at a resonant frequency; an electrically reactive element associated with said moveable mechanical control, wherein said electrically reactive element provides a variable modification to a response of said first tuned resonant circuit dependent on a relative position of said electrically reactive element with respect to first tuned resonant circuit; and read-out electronics coupled to one or both of said first tuned resonant circuit and said electrically reactive element, to provide a variable output signal responsive to said relative position of said electrically reactive element with respect to first tuned resonant circuit, wherein said variable output signal of said read-out electronics provides said position sensor output coupled to said control connection of said effect control circuit.

The above described technique has been found to be particularly reliable and effective. Preferably, but not essentially, the electrically reactive element comprises a second tuned resonant circuit tuned to a frequency at which the first tuned resonant circuit is driven. Optionally multiple first and second tuned resonant circuits may be employed, each operating at a different respective frequency, to provide a plurality of respective control parameters for one or more musical effects.

A particularly advantageous coil arrangement has been found to be a flat or planar coil defined by tracks on a printed circuit board, as this helps achieve a well defined, repeatable geometry. The flat spatial configuration is also advantageous, particularly for a foot pedal type device, when one coil may be mounted on the base and a second on the foot plate. Where the foot plate is metal the coil may be slightly spaced away from the foot plate, to reduce de-tuning, but this is not essential. In embodiments the foot plate incorporates a stop, for example opposite a hinge at one end of the foot plate, to inhibit the coils of the first and second tuned circuits from touching when the foot plate is fully depressed.

In another embodiment the moveable mechanical control is a wearable control, to provide additional scope for musical effect modification. For example the moveable mechanical control may comprise a wrist band or strap on which is attached the second tuned resonant circuit. In embodiments the coil of the second tuned resonant circuit is smaller (as a smaller lateral extent) than that of the first tuned circuit, which may be mounted on the instrument. This helps to achieve increased range and reliable operation.

In a related aspect the invention provides a method of controlling a musical effects device, the method comprising: providing the device with a moveable control; providing an electrically reactive element for said moveable control; sensing a position of said moveable control using a driven tuned resonant circuit and read-out electronics coupled to one or both of said electrically reactive circuit and said tuned resonant circuit to sense a relative position of said moveable control and said tuned resonant circuit by sensing a signal from said driven tuned circuit; and controlling said musical effects device using said position sensing.

The invention also provides a position sensor comprising an active tuned resonant circuit, providing a signal which varies as the mutual separation of said active tuned resonant circuit and an electrically reactive element is varied, drive electronics connected to said active tuned resonant circuit and read-out electronics connected to either said active tuned resonant circuit or said electrically reactive element.

BRIEF DESCRIPTION OF THE DRAWINGS

These and other aspects of the invention will now be described in detail, with reference to the accompanying drawings, in which.

DESCRIPTION OF PREFERRED EMBODIMENTS

Figure 1:
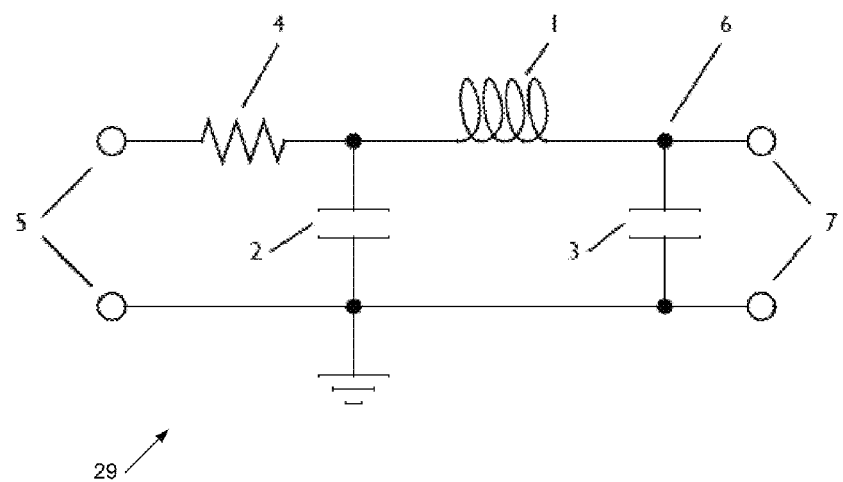
FIG. 1 shows an active tuned resonant circuit according to the present invention.

A preferred embodiment comprises an active tuned resonant circuit 29, as shown in FIG. 1 inductively coupled to an electrically reactive element 20, as shown in FIG. 3, henceforth referred to as the reactive element. This provides a signal which varies as the mutual separation of said active tuned resonant circuit and said reactive element is varied, a mechanism or housing which enables the mutual separation of said active tuned resonant circuit and said reactive element to be varied, drive electronics connected to said active tuned resonant circuit and read-out electronics connected to either said active tuned resonant circuit or to said reactive element.

The active tuned resonant circuit FIG. 1 comprises an input resistor 4, an inductive coil 1, two capacitive elements 2 and 3, a means of connecting 5 drive electronics to the input resistor 4 and a means of connecting 7 read-out electronics to the read-out point 6. The input resistor 4 may be omitted, but it is preferred because it performs two useful functions: it limits the current supplied to said active tuned resonant circuit from said drive electronics which reduces the operating current required and thus reduces both power consumption and electro-magnetic emissions from said active tuned resonant circuit; and increases the sensitivity of proximity detection when the read-out electronics are connected to said active tuned resonant circuit. The inductive coil 1 provides a means of coupling between said active tuned resonant circuit and the reactive element. The capacitive elements 2 and 3 together with the inductive coil 1 form a resonant LC circuit. The total value of the capacitance can be adjusted to tune the frequency of resonance of said active tuned resonant circuit. In the case where said input resistor 4 is not used, only one capacitive element 3 is required.

Figure 2A:
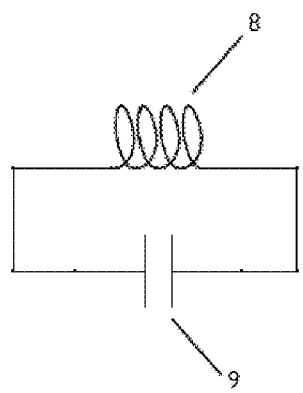
FIGS. 2A and 2B shows a passive tuned resonant circuit according to the present invention.

Referring to FIG. 2, the reactive element preferably comprises a passive tuned resonant circuit which comprises an inductive coil 8, a capacitive element 9 and optionally a means of connecting 11 read-out electronics to the read-out point 10. In the case where said read-out electronics are connected to the active tuned resonant circuit FIG. 1 said inductive coil 8 and capacitive element 9 are connected to form a closed resonant LC circuit FIG. 2A. The value of the capacitance of said capacitive element 9 is preferably chosen to tune the frequency of resonance of said passive tuned resonant circuit to match that of said active tuned resonant circuit FIG. 1. When said passive and active circuits are thus tuned, it is possible to operate in close proximity a plurality of sensors according to the present invention which can be used, for example, to simultaneously measure different axes of motion such as but not limited to horizontal, vertical and rotational.

The reactive element may alternatively comprise an electrically conductive object when the read-out electronics are connected to the active tuned resonant circuit 7 in FIG. 1. However, the range of mutual separation of the active tuned circuit and the electrically conductive object over which an accurate position measurement can be made is lower than when a passive tuned resonant circuit FIG. 2 is used.

The inductive coils used in the active tuned resonant circuit 1 and the passive tuned resonant circuit 8 can be of any type. However using planar spiral coils formed by tracks on a printed circuit board has three main advantages: they are inexpensive, they can be made with highly reproducible values of inductance and the printed circuit board can also be used to mount the other components required, namely the capacitive elements 2, 3 and 9. It is therefore possible to design two inductive coils whose inductance values are closely matched. In this case, one such inductive coil can be used in said active tuned resonant circuit FIG. 1, and another similar inductive coil used in said passive tuned resonant circuit FIG. 2. When such matched inductive coils are used said active and passive circuits can be tuned by matching the capacitance of the capacitive element 9 (Cp) in said passive tuned circuit FIG. 2 with the capacitance of the series combination of the two capacitive elements 2 (Ca1) and 3 (Ca2) in said active tuned resonant circuit FIG. 1, thus: $Cp=1/((1/Ca1)+(1/Ca2))$.

The inventors have found that optimal performance, where the sensitivity of position sensing and the distance over which position sensing is possible are both maximised, is achieved when the frequency of resonance of the passive tuned circuit is as close as possible to the frequency of resonance of the active tuned resonant circuit. In this case, the frequency of resonance of said active tuned resonant circuit does not change substantially when the mutual separation of said active tuned resonant circuit and said passive tuned resonant circuit is varied which in turn means that the corresponding signal at the read-out point 6 or 10 retains a constant phase offset with respect to the phase of the signal from the drive electronics thus ensuring a maximal response from the read-out electronics when using phase-sensitive detection methods. Indeed it is possible to use this phenomenon to aid the tuning of said passive resonant circuit: by observing the relative phase of said signal from said drive electronics and said signal at said read-out point, the values of the capacitive element Cp can be adjusted until said relative phase does not change substantially when said mutual separation is varied.

Figure 8:
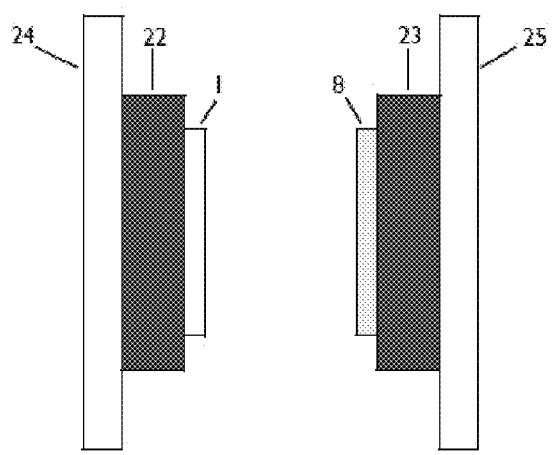
FIG. 8 shows a cross section view of non-conductive elements interposed between the inductive coils and electrically conductive elements, such as elements of an enclosure, according to embodiments of the present invention.

When the inductive coil 1 or 8 is placed close to a metallic or other electrically conductive element, such as an enclosure, the effective value of inductance of said coil is changed causing a corresponding change in the frequency of resonance of the active tuned resonant circuit or of the passive tuned resonant circuit, a phenomenon herein referred to as detuning. Such detuning can be compensated for in two ways. Firstly, referring to FIG. 8, a non-conductive element 22, such as but not limited to an air-gap or plastic spacer, can be interposed between said inductive coil 1 and said electrically conductive element 24 to reduce the amount of detuning of said active tuned resonant circuit. Similarly, a non-conductive element 23, can be interposed between said inductive coil 8 and said electrically conductive element 25 to reduce the amount of detuning of said passive tuned resonant circuit. Preferably the thickness of said non-conductive elements 22 and 23, and thus the separation of said inductive coils 1 and 8 from said conductive elements 24 and 25, shall be the same. In this way, detuning is matched and the detuned frequency of resonance of said active tuned resonant circuit will match the detuned frequency of resonance of said passive tuned resonant circuit. Secondly, the frequency of resonance of either or both of said active tuned resonant circuit and said passive tuned resonant circuit can be changed by changing the value of capacitance of one or more of the capacitive elements 2, 3 and 9 such that the detuned frequency of resonance of said active tuned resonant circuit matches the detuned frequency of resonance of said passive tuned resonant circuit.

It is preferred that in such cases said detuning does not change when the mutual separation of said active and said passive elements is changed thus ensuring that the frequency of resonance of said active and said passive elements does not change. This can be achieved by arranging for the frequency of resonance of the passive tuned circuit to substantially match the frequency of resonance of the active tuned resonant circuit.

The drive electronics comprise a means of generating an oscillating voltage drive waveform at a frequency equal to or close to the resonant frequency of the active tuned resonant circuit. Typically, but by way of non-limiting example, this waveform is a square waveform generated by the output of a microcontroller timer or a digital or analogue timing circuit.

Figure 4:
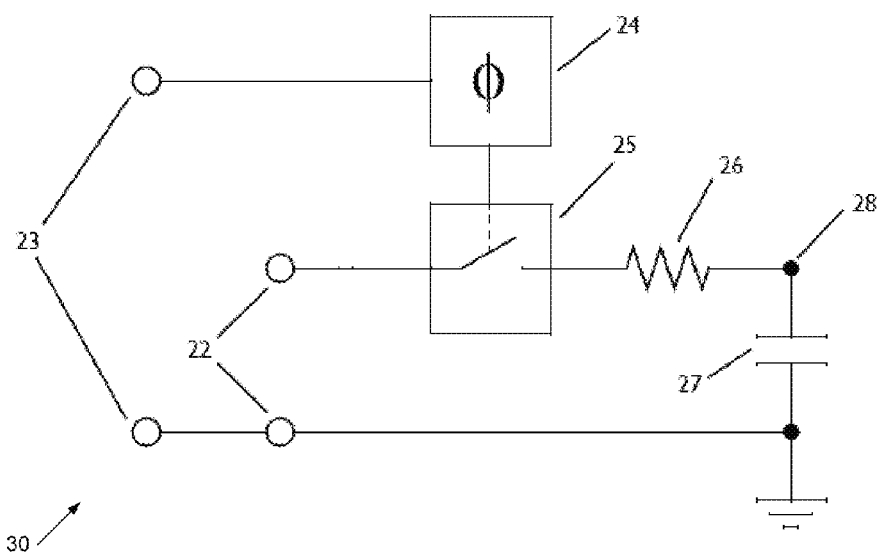
FIG. 4 shows an example of a simple read-out electronic circuit comprising a synchronous demodulator which may be used by the present invention.

The read-out electronics comprise a means of generating a low-frequency or DC voltage proportional to the amplitude of the signal at the read-out point 6 or 10. Typically, but by way of non-limiting example, this comprises a synchronous demodulator (phase sensitive detector) circuit 30 as shown in FIG. 4. The signal from said read-out point is connected to 22 and demodulated by an analogue switch 25 controlled by the oscillating voltage drive waveform connected to 23 whose phase is optionally adjusted by a phase shifting element 24 and a low-frequency (or dc) voltage is presented at 28 by a low-pass filter comprising a resistor 26 and a capacitive element 27. Alternative read-out electronic circuits may comprise phase-sensitive rectifiers, phase-insensitive rectifiers, and non-synchronous demodulators as understood by those trained in the art.

When used to indirectly control the musical signal, the low-frequency output voltage from the read-out electronics can be used to control a separate circuit element in an electronic circuit or converted to a digital value via an analogue-to-digital-converter and used as an input parameter to a digital signal processing algorithm or transmitted as musical instrument digital interface (MIDI) messages.

In the case where the present invention is used to directly control the musical signal, the drive waveform can be modulated by the musical signal, and said musical signal recovered by demodulation in the read-out electronics. The amplitude of the recovered signal thus depends directly on the mutual separation of the inductive coil of the active tuned resonant circuit 1 and the reactive element 20, thus an embodiment of the invention can itself be a circuit element in an electronic musical effect circuit.

In the case where the reactive element is a passive tuned resonant circuit FIG. 2, the active tuned resonant circuit FIG. 1 is inductively coupled to said passive tuned resonant circuit. The strength of the inductive coupling increases as the mutual separation of the centre of the two inductive coils 1 and 8 which are elements of said circuits is decreased. There is no requirement for said inductive coils to come into contact with one another, thus eliminating any mechanical wear, thus improving robustness and reliability.

Figure 2B:
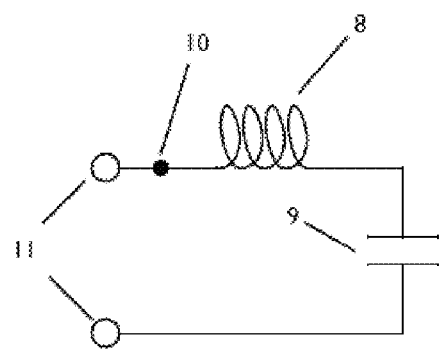

The means of operation of the inductive coupling depends on the configuration of the passive tuned resonant circuit FIG. 2. In the case where said passive tuned resonant circuit is connected to the read-out electronics FIG. 2B, the oscillating current in the inductive coil 1 of the active tuned resonant circuit FIG. 1 induces a corresponding current in the inductive coil 8 of said passive tuned resonant circuit which allows a voltage to be measured by said read-out electronics. In the case where said active tuned resonant circuit is connected to said read-out electronics and said passive tuned resonant circuit forms a closed resonant LC circuit FIG. 2A, the oscillating current in the inductive coil 1 of said active tuned resonant circuit induces a corresponding current in said inductive coil 8 of said passive tuned resonant circuit and because said passive tuned resonant circuit is a closed circuit this current is dissipated by the resistance of said inductive coil 8. Energy is thus transferred from said inductive coil 1 in said active tuned resonant circuit FIG. 1 to said inductive coil 8 in said passive tuned resonant circuit FIG. 2A. A consequence of this energy transfer is that the amount of energy that can be stored in said active tuned resonant circuit FIG. 1 is decreased as the mutual separation of said passive tuned resonant circuit and said active tuned resonant circuit is decreased. This decrease in stored energy in the active resonant circuit can be measured by the read-out electronics as a decrease in the voltage amplitude at the read-out point 6.

In the case where the reactive element is an electrically conductive object, the magnetic field generated by the active tuned resonant circuit FIG. 1 induces an eddy current in said electrically conductive object. Thus energy is transferred from said active tuned resonant circuit to said electrically conductive object, causing a reduction in the amount of energy that can be stored in said active tuned resonant circuit when the mutual separation of said electrically conductive object and said active tuned resonant circuit is decreased. However, for a given mutual separation of said active tuned resonant circuit and said reactive element, the amount of energy that is transferred in this case is lower than in the case where the reactive element is a passive tuned resonant circuit as shown in FIG. 2A and FIG. 2B.

Figure 3A:
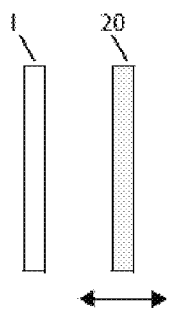
FIGS. 3A, 3B and 3C shows relative movement between the inductive coil of the active tuned resonant circuit and the electrically reactive element which can be detected according to the present invention.
Figure 3B:
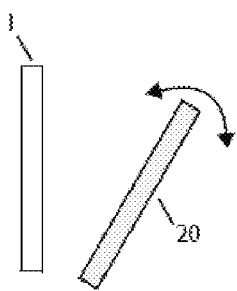
Figure 3C:
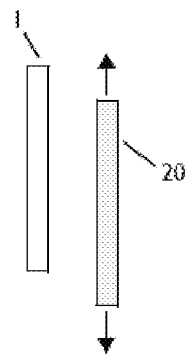

The mechanism or housing which facilitates the variable separation of the inductive coil 1 of the active tuned resonant circuit and the reactive element 20 can support different methods of movement: linear FIG. 3A, angular FIG. 3B, translational FIG. 3C, or a combination of these. Thus possible mechanisms and housings include but are not limited to: a foot pedal FIG. 5, a slider FIG. 6 and a musician moving said active tuned resonant circuit or said reactive element FIG. 7.

Such a mechanism or housing typically includes a fixed element and a moveable element. It such cases is preferable for the fixed element to contain the active tuned resonant circuit FIG. 1 to which the read-out electronics are connected, and for the moveable element to contain the reactive element 20. In this configuration no electrical connections are required to said moveable element thus improving robustness and reliability. Furthermore, this configuration allows the electronic circuits to be fully enclosed inside a non-conductive housing to further improve the reliability of the entire musical effect electronic circuits. However, it is also possible for the mechanism or housing to include two moveable elements. In such cases there is no preference for the location of said active tuned resonant circuit and said reactive element.

Figure 5:
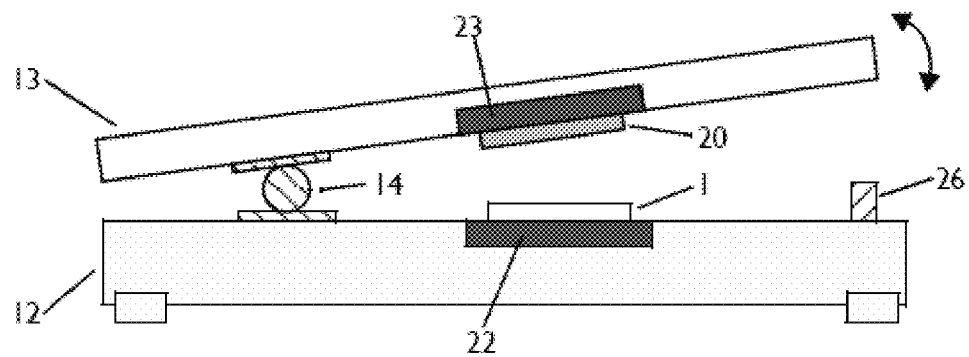
FIG. 5 shows a cross section view of a foot-pedal wherein the position of the foot-pedal is determined using the present invention.

Referring to FIG. 5, a foot-pedal may comprise a fixed base-plate 12, a moveable foot-plate 13 connected to said base-plate via a hinge mechanism 14 to facilitate controlled variation of the mutual angular separation FIG. 3B of said base-plate and said foot-plate. In such a foot-pedal, the reactive element 20 can be located in said foot-plate and the inductive coil 1 of the active tuned resonant circuit can be located in said base-plate. An end-stop element 26 maintains a minimum separation between said inductive coil 1 and said reactive element 20 to prevent contact thereof, thus improving robustness and reliability. In the case where said base-plate comprises an electrically conductive material, an air gap or spacer 22 comprised of a non-conductive material is interposed between said inductive coil 1 and said base-plate. In the case where said foot-plate comprises an electrically conductive material, an air gap or spacer 23 comprised of a non-conductive material is interposed between said reactive element 20 and said base-plate 13. When the read-out electronics are connected to said active tuned resonant circuit, there are no electrical connections required to be made to the reactive element 20 thus no electrical connection is required to movable parts thus further improving robustness and reliability.

Figure 6:
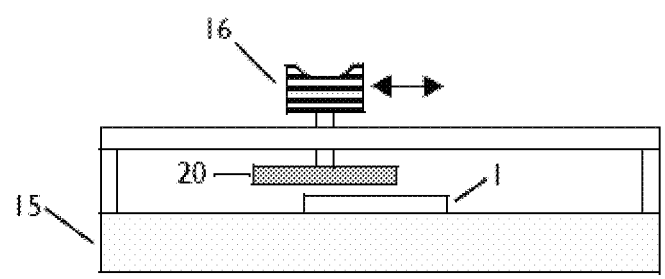
FIG. 6 shows a cross section view of a slider control wherein the position of the slider is determined using the present invention.

Referring to FIG. 6, a linear slider mechanism may comprise a fixed housing 15 and a moveable slider knob 16 moving along a track in said fixed housing wherein the mutual translational separation FIG. 3C of said fixed housing 15 and said moveable slider knob 16 can be varied as said slider knob 16 moves back and forth along its track. In such a slider mechanism, the reactive element 20 can be mounted on said moveable slider knob 16 and the inductive coil 1 of the active tuned resonant circuit can be located in said fixed housing 15. When the read-out electronics are connected to said active tuned resonant circuit, there are no electrical connections required to be made to the reactive element 20 thus no electrical connection is required to movable parts thus improving robustness and reliability.

Figure 7:
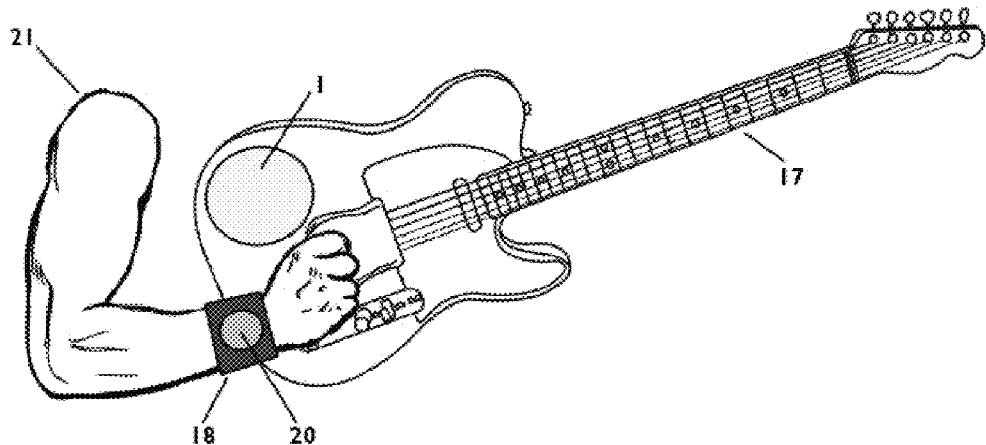
FIG. 7 shows a musician playing a musical instrument wherein said musician is wearing the electrically reactive element and said musical instrument incorporates the active tuned resonant circuit according to the present invention.

Referring to FIG. 7, a musician may vary their position relative to a musical instrument and it is desirable to use the musician's movement as a means of controlling the sound from the musical instrument. In this case, the inductive coil 1 of the active tuned resonant circuit can be located in an electronic component or musical instrument 17 that forms part of the electronic musical instrument environment used by the musician and the reactive element 20 can be located in a moveable element 18 that the musician holds or wears such as, by way of non-limiting examples, jewelry, a musical instrument, a baton or clothing. Because there need be no electrical connections to said reactive element 20 the moveable element 18 can be moved freely by the musician. Furthermore, in the case of said reactive element comprising a passive tuned resonant circuit FIG. 2A whose frequency of resonance is tuned to match that of said active tuned resonant circuit, multiple sets of active tuned resonant circuits and passive tuned resonant circuits can be combined when each set is tuned to operate at a resonant frequency different from the other sets. In this case it is possible for a musician to independently control different aspects of their performance by varying the positions of each reactive element independently.

Figure 9:
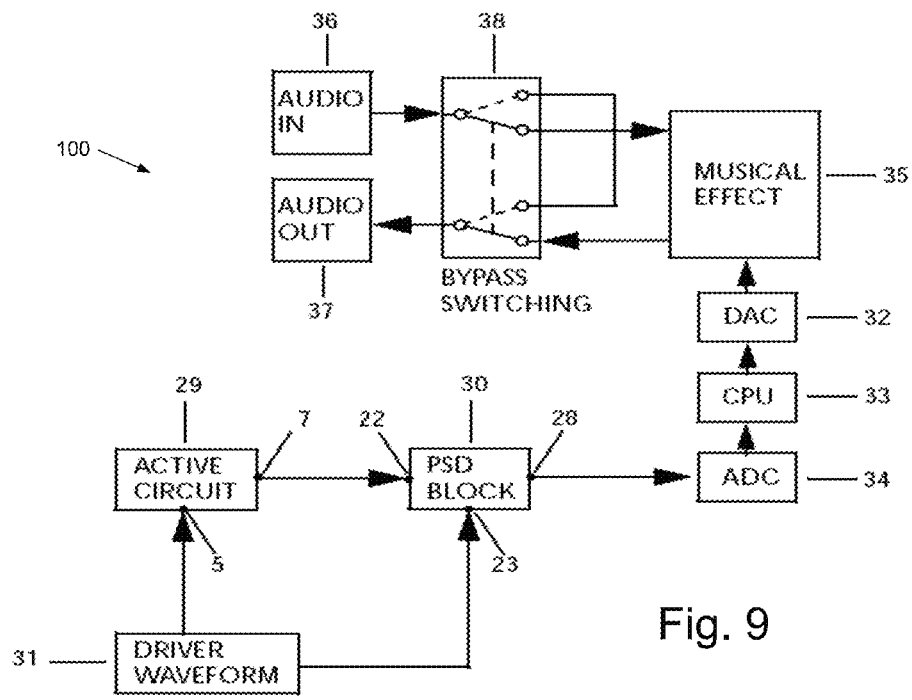
FIG. 9 shows a block diagram of a first embodiment of a musical effects device according to the invention.

FIG. 9 shows a block diagram of a first embodiment of a musical effects device 100 according to the invention. In this embodiment a drive waveform 31 such as a square or rectangular waveform is produced by, for example, a microcontroller or other processor and provided to an input 5 of an active circuit 29 of the type shown in FIG. 1. The driver waveform is also provided to input 23 of the phase sensitive detector block 30 of FIG. 4. The output 7 of the active circuit 29 provides a second input to the phase sensitive detector block 30, which has an output 28 as shown in FIG. 4. Optionally in embodiments the relative phase of the waveforms at inputs 5 and 23 is controllable to maximise the output from PSD block 30.

In the embodiment of FIG. 9 the demodulated output is provided to an analogue-to-digital converter 34 which provides an input to a processor 33. Processor 33 controls the musical effects device and may optionally provide a user interface and/or display, for example to allow user setting of the sensitivity, type of effect and the like, and to provide corresponding user feedback via a display. Thus processor 33 provides one or more digital control signals to a digital-to-analogue converter 32 which in turn provides an analogue voltage or current level to control the strength or other parameter of a musical effect applied by effects block 35. The skilled person will be aware of many potential effects which may be applied including, but not limited to, wah-wah, fuzz and reverb. In one example the musical effects block 35 provides one or more controllable analogue filters, each filter being configurable as a low-pass filter or a band-pass filter, each able to operate independently under pedal control, optionally in combination with envelope control and/or a low frequency oscillator and/or a pitch tracking mode. Thus the user controls may include, for example, a mode control and a filter select control as well as a level control and, optionally, means for allowing the user to select a parameter to be controlled by the pedal of the effects device. The musical effects block 35 is coupled to a bypass switching block 38 which is in turn coupled to an audio input 36 and an audio output 37.

Figure 10:
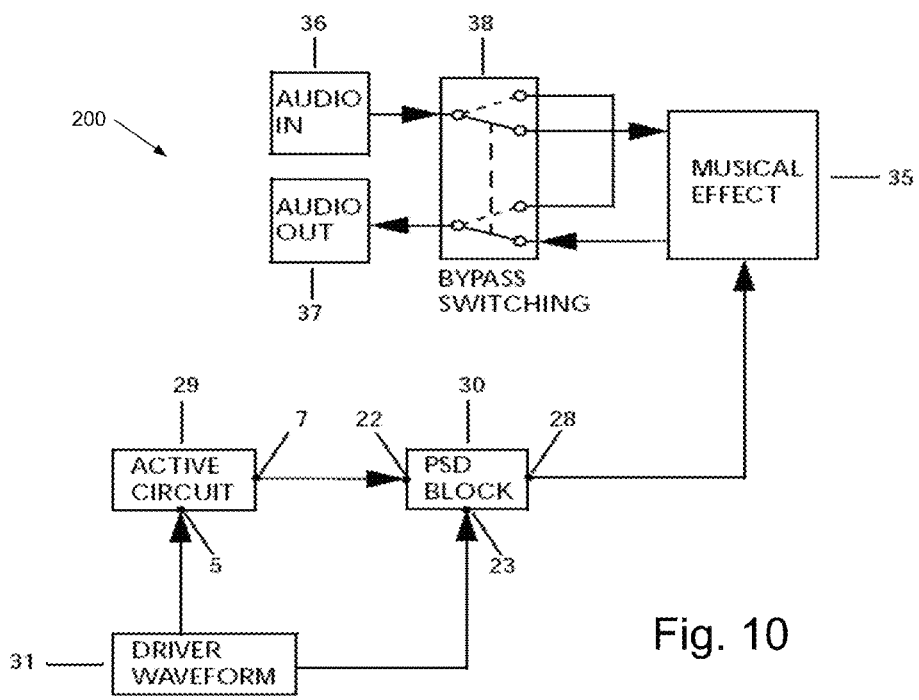
FIG. 10 shows a block diagram of a second embodiment of a musical effects device according to the invention.

FIG. 10 shows a second embodiment of a musical effects device 200, illustrating a variant of the device of FIG. 9 in which the output 28 of the phase sensitive detector block 30 provides an analogue signal level output which is used to directly control the musical effects block 35. Like elements to those of FIG. 9 are indicated by like reference numerals.

Figure 11:
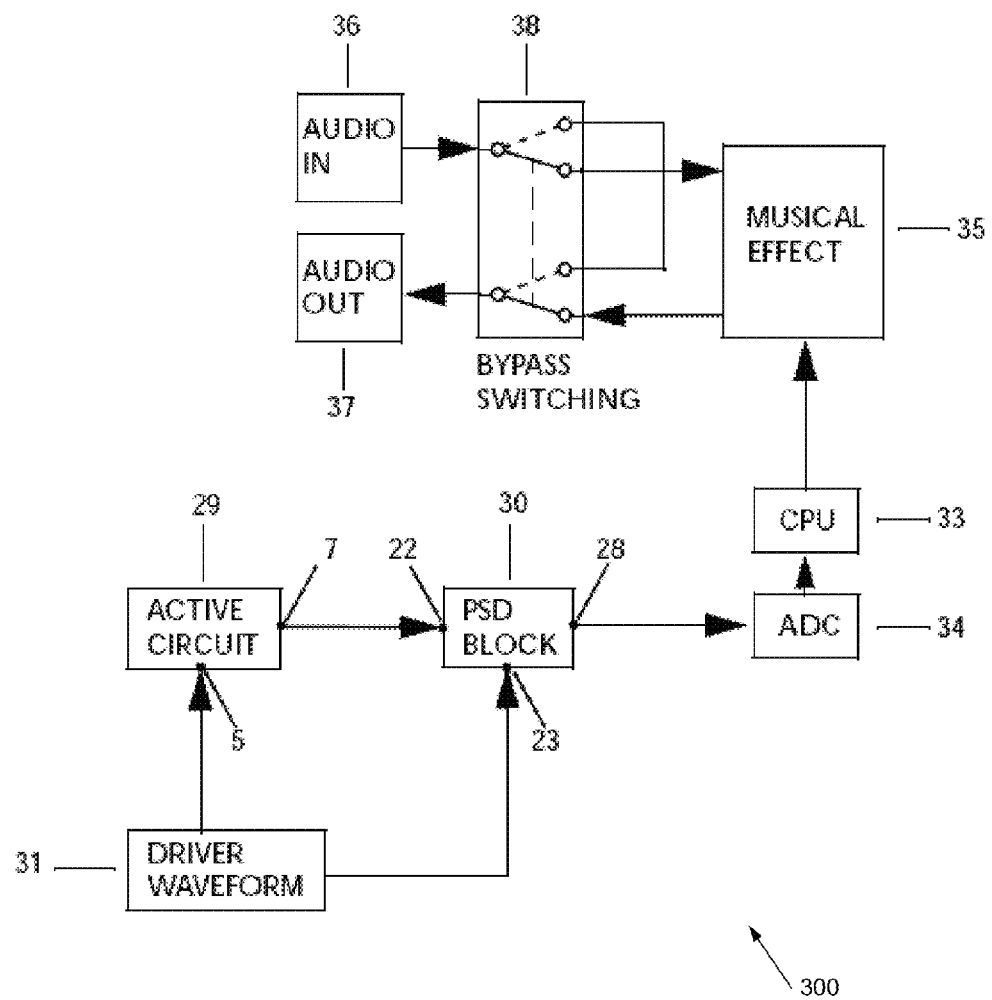
FIG. 11 shows a block diagram of a third embodiment of a musical effects device according to the invention.

FIG. 11 shows a third embodiment of a musical effects device 300, again in which like reference elements to those of FIG. 9 are indicated by like reference numerals. In the arrangements of FIG. 11 processor 33 provides a digital output to control musical effects block 35.

Figure 12A:
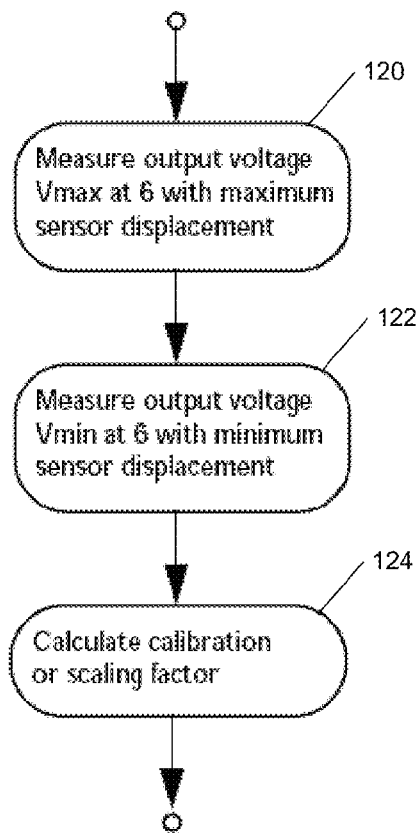
FIGS. 12a and 12b illustrate an example calibration procedure for the musical effects devices of FIGS. 9 to 11 and the application of the calibration procedure.
Figure 12B:
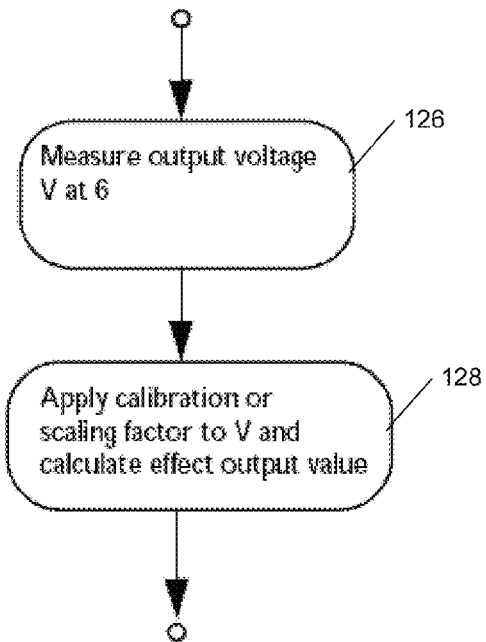

FIG. 12a shows an example calibration procedure for the devices of FIGS. 9 to 11. The procedure begins by measuring 120 the output voltage Vmax at point 6 of the active circuit of FIG. 1 with maximum sensor displacement. The procedure then measures 122 the output voltage at this point with minimum sensor displacement, Vmin, and then calculates 124 a calibration or scaling factor from these measurements. FIG. 12b shows application of the calculated calibration/scaling factor during operation of the musical effects device: the output voltage at point 6 is measured 126 and then processor 33 applies 128 the previously determined calibration or scaling factor to the measured output voltage to calculate an output value for use in applying the musical effect.

In summary, we have described a non-contact sensor which can be used in a variety of ways to control aspects of a musical instrument's sound, whilst overcoming the deficiencies in previously developed sensors used for this purpose.

No doubt many other effective alternatives will occur to the skilled person. Whereas the present invention has been described with respect to specific embodiments thereof, it will be understood that the invention is not limited to the described embodiments and encompasses modifications apparent to those skilled in the art lying within the spirit and scope of the claims appended hereto.

We claim:

1. A musical effect device having an input to receive an input signal from an electric or electronic musical instrument or microphone, an output to provide an output signal comprising modified version of said input signal, and an effect control circuit coupled between said input and said output to apply a controllable effect to said input signal to provide said output signal, wherein said effect control circuit has a control connection to control a level of said controllable effect applied to said input signal; and wherein said musical effect device further comprises a moveable mechanical control and a position sensor having an output coupled to said control connection, to sense a position of said moveable mechanical control, wherein said position sensor comprises:

a first tuned resonant circuit;

drive electronics coupled to said tuned resonant circuit to drive said first tuned resonant circuit with a drive signal at a resonant frequency;

a second, passive tuned resonant circuit associated with said moveable mechanical control, wherein said electrically reactive element provides a variable modification to a response of said first tuned resonant circuit dependent on a relative position of said second, passive tuned resonant circuit with respect to first tuned resonant circuit; and read-out electronics coupled to said first tuned resonant circuit, to provide a variable output signal responsive to said relative position of said second, passive tuned resonant circuit with respect to said first tuned resonant circuit, wherein said variable output signal of said read-out electronics provides said position sensor output coupled to said control connection of said effect control circuit;

wherein a first frequency of resonance of said first tuned resonant circuit matches a second frequency of resonance of said second, passive tuned circuit, and wherein said first and second frequency resonance match said resonant frequency of said drive signal;

wherein said first tuned resonant circuit comprises an input coupled to said drive electronics, an output coupled to said read-out electronics and a resonant LC circuit coupled in series between said input and said output; and wherein said variable output signal is dependent on an amplitude of a signal at said output of said first tuned resonant circuit.

2. A musical effect device as claimed in claim 1, wherein said first tuned resonant circuit comprises an input resistor and an inductor coupled in series between said input and said output; and first and second capacitors coupled in parallel between said series inductor and a common connection between said input and said output.

3. A musical effect device as claimed in claim 1, wherein said first and second resonant circuits each comprise a coil and a capacitance, wherein one or both of said first and second resonant circuits is detuned to a respective detuned said first and/or second frequency of resonance by a metallic or other electrically conductive element of said musical effects device, wherein said capacitance of one or both of said first and second resonant circuits is selected such that the said detuned first and/or second frequencies of resonance match and match said resonant frequency of said drive signal, and wherein said read-out electronics comprises a synchronous demodulator circuit coupled to said drive signal and to said output of said first resonant circuit.

4. A musical effect device as claimed in claim 1, comprising a plurality of said first and second tuned resonant circuits each associated with a or the moveable mechanical control, each with a different respective tuned frequency, and each to sense a different respective movement, wherein said read-out electronics is configured to provide a plurality of respective said variable output signals for said plurality of second tuned resonant circuits, and wherein said effects control circuit has a set of controllable effect parameters each modified by a respective said variable output signal.

5. A musical effect device as claimed in claim 1, wherein one or both of said first tuned resonant circuit and said second tuned resonant circuit each comprises a coil defined by tracks on a printed circuit board.

6. A musical effect device as claimed in claim 1, wherein one or both of said device is a foot pedal device, and wherein said second, passive tuned resonant circuit is located in or on a moveable foot-plate of said foot pedal device.

7. A musical effect device as claimed in claim 6, wherein said second tuned circuit is spaced away from said foot plate.

8. A musical effect device as claimed in claim 6, wherein said first and second tuned resonant circuits each comprise a coil with a substantially planar surface mounted opposite one another on said foot pedal device and said foot-plate.

9. A musical effect device as claimed in claim 1, wherein said moveable mechanical control is a wearable control, in particular in combination with said instrument, wherein at least a coil of said first tuned resonant circuit of said musical effects device is mounted on said instrument.

* * * * *